United States Patent [19]
Mang et al.

[11] Patent Number: 5,698,928
[45] Date of Patent: Dec. 16, 1997

[54] THIN FILM PIEZOELECTRIC ARRAYS WITH ENHANCED COUPLING AND FABRICATION METHODS

[75] Inventors: Luke Mang, Phoenix; Sung P. Pack, Tempe; Dean Barker, Chandler, all of Ariz.

[73] Assignee: Motorola, Inc., Schaumburg, Ill.

[21] Appl. No.: 516,221

[22] Filed: Aug. 17, 1995

[51] Int. Cl.$^6$ ............................................. H01L 41/08
[52] U.S. Cl. ........................... 310/322; 310/334; 333/186
[58] Field of Search ................................. 310/322, 334, 310/358

[56] References Cited

U.S. PATENT DOCUMENTS

| | | | |
|---|---|---|---|
| 2,406,792 | 9/1946 | Benioff | 310/322 |
| 4,398,325 | 8/1983 | Piaget et al. | 310/334 |
| 4,890,268 | 12/1989 | Smith et al. | 310/334 |
| 5,030,874 | 7/1991 | Saito et al. | 310/334 |
| 5,045,746 | 9/1991 | Wersing et al. | 310/334 |
| 5,142,187 | 8/1992 | Saito et al. | 310/358 |
| 5,311,095 | 5/1994 | Smith et al. | 310/334 |
| 5,432,396 | 7/1995 | Sato et al. | 310/334 |

FOREIGN PATENT DOCUMENTS

| | | | |
|---|---|---|---|
| 0 019 267 | 11/1980 | European Pat. Off. | 310/334 |
| 0067399 | 4/1982 | Japan | 310/334 |
| 0087299 | 5/1982 | Japan | 310/334 |
| 0201800 | 10/1985 | Japan | 310/334 |

OTHER PUBLICATIONS

"A monolithic surface acoustic wave charge transfer device and its applications" by N.A. Papanicolaou et al. Optical Engineering, Jul./Aug. 1980.

*Primary Examiner*—Thomas M. Dougherty
*Attorney, Agent, or Firm*—Eugene A. Parsons

[57] ABSTRACT

An array of thin film piezoelectric resonators are formed on a substrate and connected in parallel to form a single piezoelectric resonator with enhanced piezoelectric coupling. The array includes a first conductive layer positioned on the substrate and defining a first electrode, a plurality of columns of piezoelectric material positioned on the conductive layer and each defining a separate piezoelectric resonator, and a second conductive layer positioned on the plurality of columns and defining a second electrode. The columns are selectively deposited or deposited as a single layer and etched into columns.

6 Claims, 4 Drawing Sheets

THIN FILM PIEZOELECTRIC ARRAYS WITH ENHANCED COUPLING AND FABRICATION METHODS

FIELD OF THE INVENTION

The present invention pertains to piezoelectric resonators and especially to thin film piezoelectric resonators with enhanced piezoelectric coupling.

BACKGROUND OF THE INVENTION

One of the largest components in hand-held radios are the RF filters. To reduce the size of the filters, piezoelectric resonators are utilized as the major filter components to replace ceramic filters. Thus, thin film resonators formed on a semiconductor substrate or the like have been developed. These resonators are generally a thin layer of metal deposited on the surface of the substrate, a layer of piezoelectric material deposited on the metal layer and a second metal layer deposited on the surface of the piezoelectric material.

As will be understood by those skilled in the art, it is generally desirable to manufacture filters with an appropriate input impedance to prevent coupling of unwanted signals through the filter. In the case of thin film piezoelectric filters, the impedance is chiefly dependent upon the impedance level of the piezoelectric resonator or resonators. Further, the impedance level of each piezoelectric resonator is determined primarily by the total surface area of the layer of piezoelectric material sandwiched between the two electrodes. This generally implies a surface with linear dimensions much larger than the thickness of the resonator.

In order for the piezoelectric resonator to operate properly and efficiently it is necessary to have a large piezoelectric coupling constant at the operating frequencies. At present, usable materials in the gigahertz region include zinc oxide (ZnO) and aluminum nitride (AlN). To date, these materials have been used the most and are, therefore, the most developed technologically. Generally, these materials exhibit coupling constants, in thin film piezoelectric resonators, that are borderline for many applications (i.e., coupling constants of a few percent). The low coupling coefficients translates directly to filters of 2-3% bandwidth that can be realized traditionally with these materials. However, if the coupling constants were increased, it would substantially simplify filter design and processing requirements.

Accordingly, it would be highly beneficial to devise new piezoelectric resonators that overcome these problems.

It is a purpose of the present invention to provide new and improved thin film piezoelectric resonators with enhanced piezoelectric coupling.

It is another purpose of the present invention to provide new and improved thin film piezoelectric resonators with enhanced piezoelectric coupling for use in piezoelectric BAW filters with increased bandwidth.

It is another purpose of the present invention to provide new and improved thin film piezoelectric resonators with enhanced piezoelectric coupling for use in piezoelectric BAW filters with increased bandwidth whereby the cost of manufacturing is reduced due to the relaxation of tolerances.

It is another purpose of the present invention to provide new and improved thin film piezoelectric resonators in which the piezoelectric coupling constants are increased by reducing the stiffness coefficient.

It is another purpose of the present invention to provide new and improved thin film piezoelectric resonators in which the realizable bandwidth is more than twice that of prior art structures.

SUMMARY OF THE INVENTION

The above problems and others are at least partially solved and the above purposes and others are realized in an array of thin film piezoelectric resonators formed on a substrate and connected in parallel to form a single piezoelectric resonator with enhanced piezoelectric coupling. The array includes a first conductive layer positioned on the substrate and defining a first electrode, a plurality of columns of piezoelectric material positioned on the conductive layer and each defining a separate piezoelectric resonator, and a second conductive layer positioned on the plurality of columns and defining a second electrode. The columns are selectively deposited or deposited as a single layer and etched into columns.

BRIEF DESCRIPTION OF THE DRAWINGS

Referring to the drawings, wherein like characters indicate like parts throughout the various subsets of figures.

DESCRIPTION OF THE PREFERRED EMBODIMENTS

Figure 1:
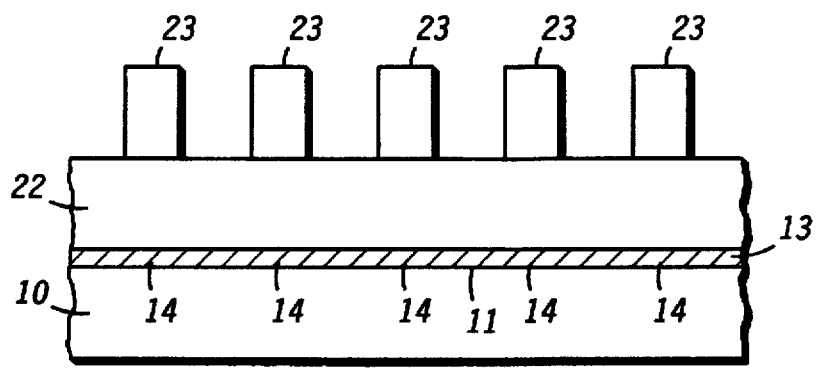
FIGS. 1–4 are simplified cross-sectional views of an array of thin film piezoelectric resonators with enhanced piezoelectric coupling, in accordance with the present invention, illustrating various stages of fabrication.

Turning now to the drawings, FIGS. 1–4 are simplified cross-sectional views of an array of thin film piezoelectric resonators with enhanced piezoelectric coupling, in accordance with the present invention, illustrating various stages of fabrication. Referring specifically to FIG. 1, a supporting substrate 10 is illustrated having a planar surface 11. Substrate 10 can be formed of any convenient material, such as semiconductor wafers, or portions thereof, etc.

A first conductive layer 13 is positioned on surface 11 of substrate 10 so as to define a first electrode 14 for each of a plurality of thin film piezoelectric resonators in an array 15. It should be understood that in this specific embodiment conductive layer 13 covers surface 11 of substrate 10 so that first electrodes 14 are simply areas within layer 13, but in some specific applications it may be desirable to pattern individual electrodes on surface 11 and connect them by patterned leads or the like. This may be especially true if array 15 is not a two dimensional array but, instead, takes some other form, e.g. an elongated row of piezoelectric resonators.

Figure 2:
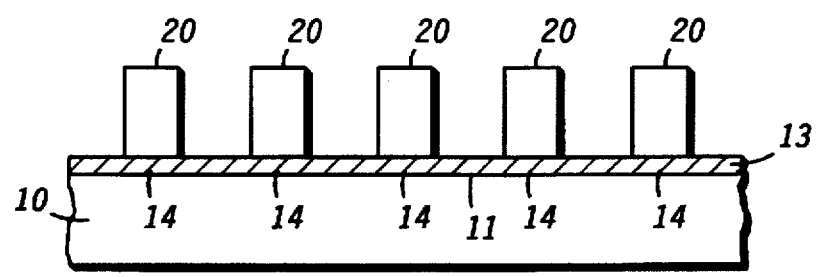

A plurality of columns 20 of piezoelectric material are positioned on conductive layer 13 so that one column overlies each of the designated first electrodes 14, and, therefore each define a separate piezoelectric resonator. While there are different processes for forming columns 20, some of which will be described presently, the process used in this specific example is to deposit a blanket layer 22 of piezoelectric material by any convenient method and pattern layer 22 into columns 20. Specifically, a layer 23 of photoresist is patterned onto the upper surface of blanket layer 22 to overlie or define columns 20. Blanket layer 22 is then etched and layer 23 is removed, as illustrated in FIG. 2.

In a slightly different method, a layer of photoresist can be placed directly on conductive layer 13 and patterned to provide openings defining columns 20. Piezoelectric material is then deposited on conductive layer 13 in the openings through the photoresist to form columns, after which the photoresist is removed from between the columns. It will of course be understood that photoresist is described in both of these processes because it is simple to use and is commonly used in the semiconductor industry, however, other materials can be used for the masking purpose if desired and convenient.

Figure 3:
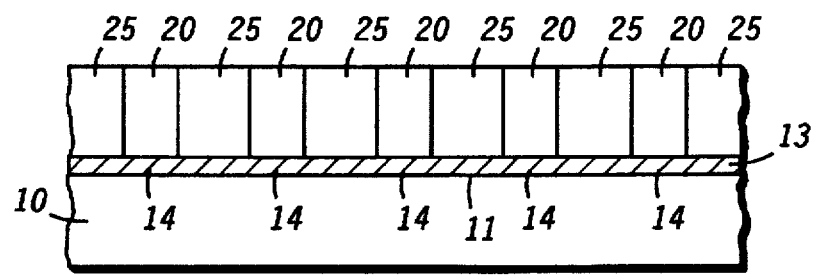
Figure 4:
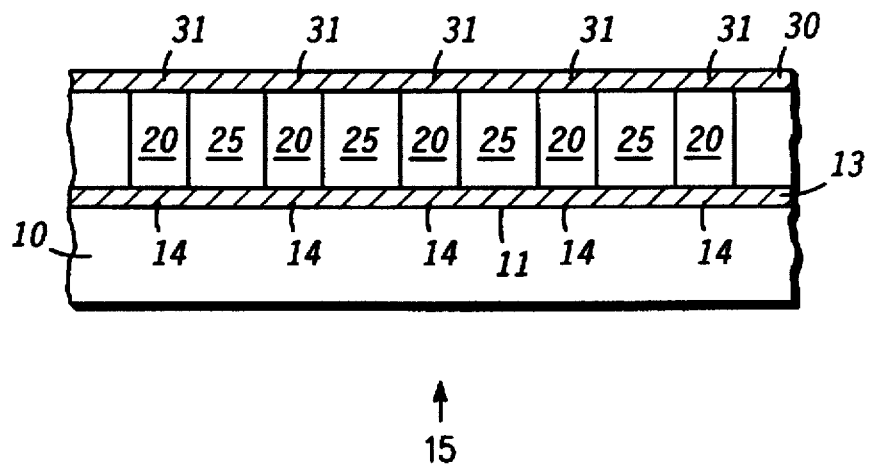

Referring now to FIG. 3, the entire structure is planarized by depositing a layer 25 of some soluble material which is easily positioned between columns 20 and easily removed subsequent to the following operations. Again, a convenient soluble material to use for layer 25 is photoresist or other similarly soluble material. Layer 25 is introduced between columns 20 and then etched or otherwise partially removed to expose the upper ends of each of columns 20, as illustrated in FIG. 3. At this point the upper ends of columns 20 and the upper surface of layer 25 form a common plane.

A second conductive layer 30 is positioned on the planar surface of the structure so as to be in contact with the upper surface of each column 20 and defining a second electrode 31 for each of the piezoelectric resonators in array 15. Again, in this specific embodiment conductive layer 30 covers the planar surface so that second electrodes 31 are simply areas within layer 30, but in some specific applications it may be desirable to pattern individual electrodes on the planar surface and connect them by patterned leads or the like. This may be especially true if array 15 is not a two dimensional array but, instead, takes some other form, e.g. an elongated row of piezoelectric resonators.

Figure 5:
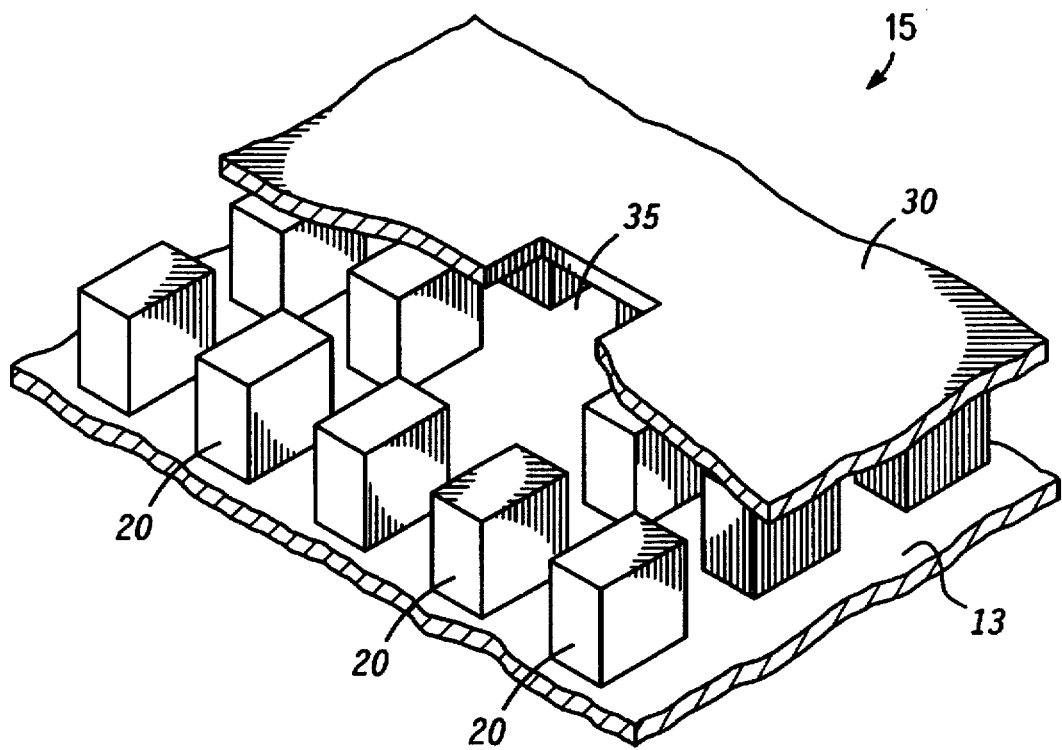
FIG. 5 is a perspective view of the structure of FIG. 4 illustrating some additional details of the fabrication process.

In some instances, especially where relatively large numbers (e.g., thousands) of piezoelectric resonators are being formed in a single two dimensional array, it may be difficult for a solvent to reliably penetrate from the edge into the center areas of the array. To overcome this problem some of columns 20 are etched away, as illustrated in FIG. 5. This could be accomplished, for example, during the etching of piezoelectric layer 22 by simply forming the etch mask to etch the space where the columns would normally be formed, along with the surrounding area. It is estimated that something like 1% of the columns could be removed in relatively large arrays to enhance the later removal of soluble material 25. Access openings 35 are then etched in conductive layer 30 at the positions of the missing columns, as illustrated in FIG. 5. In this way a solvent can be introduced through access openings 35, as well as along the edges of array 15 so that all of layer 25 is reliably and efficiently removed.

Thus, array 15 of small piezoelectric resonators is formed with all of the piezoelectric resonators connected in parallel by first and second electrodes 14 and 31. Because each column 20 is free from surrounding materials, each column 20 can expand laterally while it is compressed. The coupling constant in the axial direction of columns 20 is larger than the prior art plates of material because the sidewalls are no longer clamped but are free to move. This freedom of movement is equivalent to reducing the stiffness of the piezoelectric layer in the resonator, thereby reducing the stiffness coefficient. Reducing the stiffness coefficient of the piezoelectric layer substantially improves the coupling constant of the piezoelectric resonator.

In prior art resonators, piezoelectric material, such as ZnO or AlN, have piezoelectric coupling constants of a few percent, which directly translates to piezoelectric filters of 2% to 3% bandwidth. Generally, the improved coupling constant is observable for column height/diameter ratios greater than 2, although lower ratios will improve the coupling constants a lesser amount. Also, present frequencies of interest require thicknesses of piezoelectric layer 22 in the order of one micron. By reducing the stiffness coefficient and improving the coupling constant in accordance with the present invention, the realizable bandwidth of a piezoelectric filter fabricated from the present novel piezoelectric resonator or resonators, utilizing known piezoelectric materials such as ZnO or AlN, is more than doubled. Basically, the novel piezoelectric resonators and methods of fabrication obviate the need to look for newer thin film materials that have larger electromechanical coupling coefficients.

Figure 6:
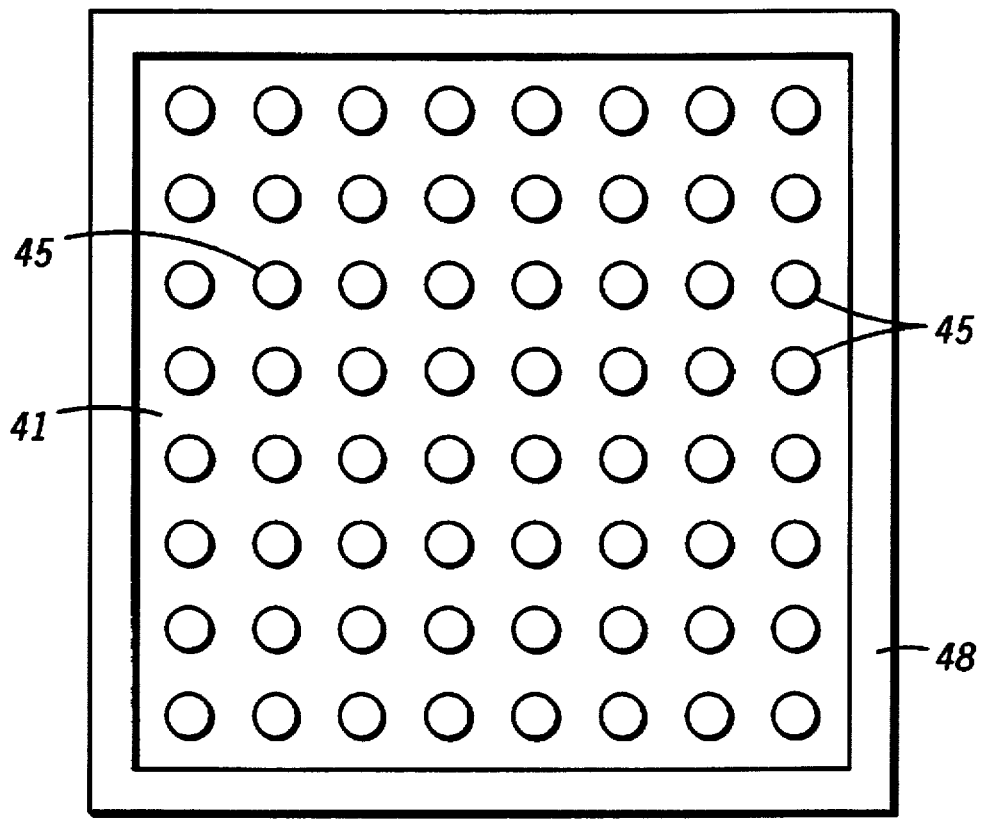
FIG. 6 is a view in top plan of another embodiment of an array of thin film piezoelectric resonators with enhanced piezoelectric coupling, in accordance with the present invention, illustrating a first step in another fabrication process.
Figure 7:
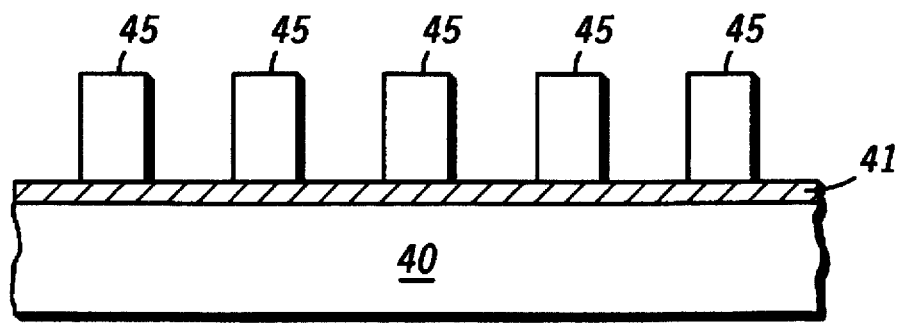
FIGS. 7–10 are simplified cross-sectional views of the array of FIG. 6, illustrating various stages of the fabrication process.

Turning now to FIG. 6 and FIGS. 7–10, another embodiment of an array of thin film piezoelectric resonators with enhanced piezoelectric coupling, in accordance with the present invention, is illustrated. Referring specifically to FIGS. 6 and 7, a top plan view and simplified cross-sectional view, respectively, of the thin film piezoelectric resonator in an intermediate step of the fabrication process are illustrated. In this embodiment, a substrate 40 and conductive layer 41 are formed substantially as described above. A layer of piezoelectric material is then selectively deposited to form a plurality of columns utilizing one of several processes, a specific one of which is described below.

Figure 8:
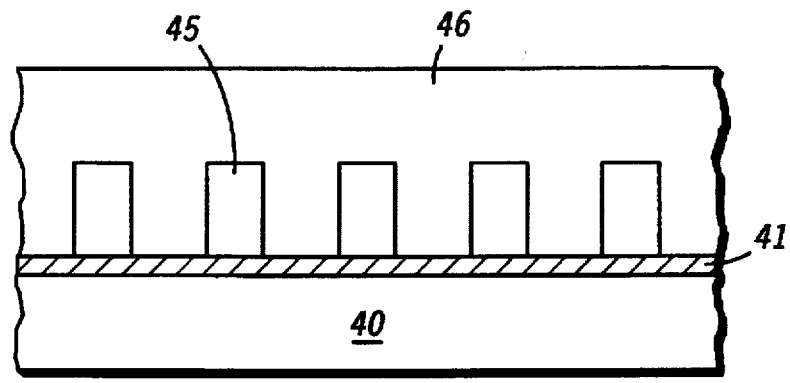

In this specific example, the well known technique of sputtering the piezoelectric material (ZnO, AlN, etc.) onto a seed material is utilized. Sputtered materials deposit differently with respect to various seed materials on which it grows. For example, there are some seeds that promote 0001 growth and are denser packed than other seed materials. Thus, by selecting an appropriate seed material 45 and patterning it onto the surface as illustrated in FIG. 6, a basis for the sputtering process is formed. Since the seed is very thin, the patterning can be accomplished in any of the well known processes including photolithography, etc. A very thin blanket layer 46 is then sputtered onto the surface of the structure including seed material 45, as illustrated in FIG. 8. Blanket layer 46 has slightly varying packing densities, with the denser packing occurring over patterned seed material 45.

Figure 9:
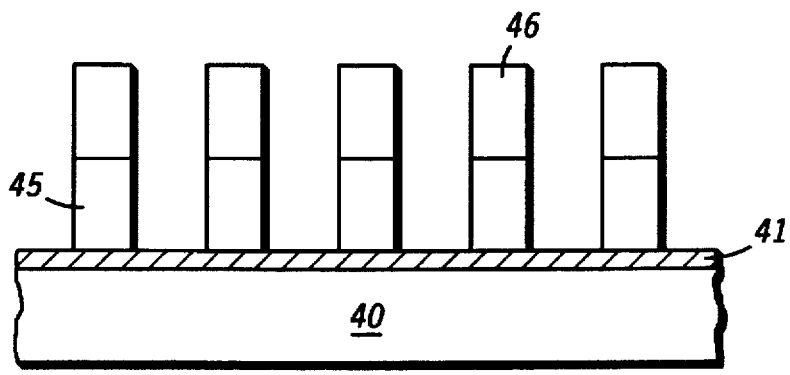
Figure 10:
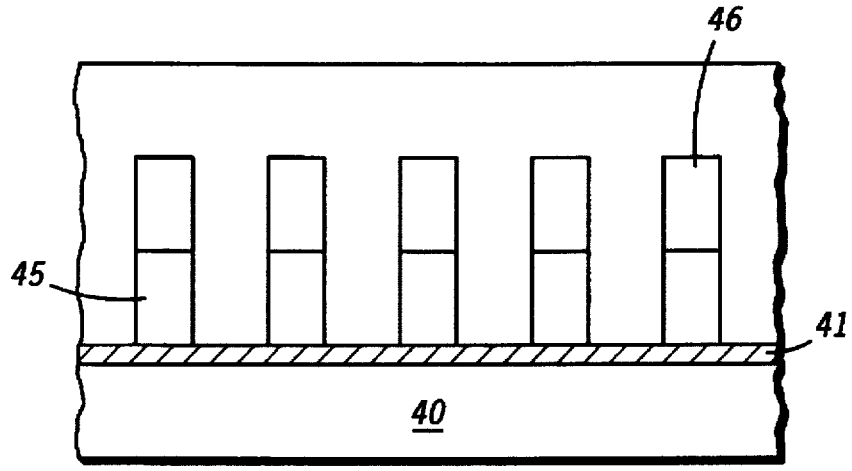

As will be understood by those skilled in the art, sputtering systems are capable of sputter depositing and can also be reversed so as to sputter etch. In the present process, once blanket layer 46 is properly deposited, the sputter system is reversed and the piezoelectric material between patterned portions of seed layer 45 is removed. Thus, only portions of blanket layer 46 which overlie seed material 45 remains, as illustrated in FIG. 9. By repeating this process a large number of times, a thicker layer of piezoelectric material is built-up over patterned seed material 45 to form separate columns defining individual piezoelectric resonators. Therefore, a self-patterning process is performed using a reversible deposition system which deposits individual columns of piezoelectric material which are not touching but are closely packed in a desired resonator area.

In the case of ZnO, there are questions concerning its impurity contamination, especially when using standard patterning and etch processes which introduce, or can introduce, various impurities. Hence the selective piezoelectric film deposition process described above eliminates the patterning and etch process and avoids the contamination issues. In the case of AlN, there is a high build-up of stress in a blanket film of the material and a subsequent release of the stress by patterning and etch. By selectively depositing the AlN in small islands on the resonator areas, this build-up and subsequent release of stress is avoided and the film quality is improved.

In this embodiment, a guard ring 48 is formed around the array of resonators at the same time that the columns are formed. An upper or second electrode is evaporated onto the upper surface of the columns and guard ring 48 at a glancing angle to seal the structure and prevent foreign material from lodging in the space between columns.

Accordingly, new and improved thin film piezoelectric resonators with enhanced piezoelectric coupling for use in piezoelectric BAW filters with increased bandwidth are disclosed along with improved processes for fabrication. Using the improved fabrication processes provides improved thin film piezoelectric resonators wherein the cost of manufacturing is reduced due to the relaxation of tolerances. In the new and improved thin film piezoelectric resonators, the piezoelectric coupling constants are increased by reducing the stiffness coefficient, which results in increasing the realizable bandwidth to more than twice that of prior art structures.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. An array of thin film piezoelectric resonators with enhanced piezoelectric coupling comprising:

a substrate having a planar surface;

a first conductive thin film positioned on the surface of the substrate and defining a first electrode;

a plurality of columns of thin film piezoelectric material positioned in spaced apart relationship on the first conductive layer and each defining a separate piezoelectric resonator; and a second conductive thin film positioned on the plurality of columns and defining a second electrode, the first and second electrodes cooperating to connect the plurality of columns in parallel to form an array of thin film piezoelectric resonators with each separate piezoelectric resonator having unclamped sidewalls for reducing stiffness.

2. An array of thin film piezoelectric resonators with enhanced piezoelectric coupling as claimed in claim 1 wherein the columns of thin film piezoelectric material include one of ZnO and AlN.

3. An array of thin film piezoelectric resonators with enhanced piezoelectric coupling as claimed in claim 1 wherein each of the columns has a height/diameter ratio greater than 2.

4. An array of thin film piezoelectric resonators with enhanced piezoelectric coupling as claimed in claim 1 wherein adjacent columns are separated by at least one micron.

5. An array of thin film piezoelectric resonators with enhanced piezoelectric coupling as claimed in claim 1 wherein each of the first and second thin film conductive layers is a substantially continuous layer.

6. An array of thin film piezoelectric resonators with enhanced piezoelectric coupling comprising:

a substrate having a planar surface;

a first conductive thin film positioned on the surface of the substrate and defining a plurality of first electrodes, one each for each of a plurality of resonators, the plurality of first electrodes being electrically connected together;

a plurality of columns of piezoelectric material, one each positioned on each of the first electrodes of the conductive layer, and each of the plurality of columns defining a separate piezoelectric resonator; and a second conductive thin film positioned on the plurality of columns and defining a plurality of second electrodes, one each positioned on each of the plurality of columns, the plurality of second electrodes being electrically connected together to connect the plurality of resonators in parallel to form an array of thin film piezoelectric resonators with each separate piezoelectric resonator having unclamped sidewalls for reducing stiffness.

* * * * *